United States Patent
Wu

(10) Patent No.: US 12,389,587 B2
(45) Date of Patent: Aug. 12, 2025

(54) MEMORY, SEMICONDUCTOR STRUCTURE, AND MANUFACTURING METHOD THEREOF

(71) Applicant: CHANGXIN MEMORY TECHNOLOGIES, INC., Hefei (CN)

(72) Inventor: Runping Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 618 days.

(21) Appl. No.: 17/806,158

(22) Filed: Jun. 9, 2022

(65) Prior Publication Data

US 2023/0301056 A1     Sep. 21, 2023

Related U.S. Application Data

(63) Continuation of application No. PCT/CN2022/083716, filed on Mar. 29, 2022.

(30) Foreign Application Priority Data

Mar. 15, 2022   (CN) .......................... 202210255938.2

(51) Int. Cl.
*H01L 27/108*     (2006.01)
*H10B 12/00*      (2023.01)

(52) U.S. Cl.
CPC ........... *H10B 12/09* (2023.02); *H10B 12/315* (2023.02); *H10B 12/50* (2023.02)

(58) Field of Classification Search
CPC ....... H10B 12/09; H10B 12/50; H10B 12/315
See application file for complete search history.

(56) References Cited

U.S. PATENT DOCUMENTS

| | | | |
|---|---|---|---|
| 7,026,628 B2 | 4/2006 | Krueger | |
| 11,121,135 B1* | 9/2021 | Ikeda | H01L 23/528 |
| 11,665,883 B2* | 5/2023 | Heo | H10B 12/315 |
| | | | 257/296 |
| 2003/0077896 A1* | 4/2003 | Saito | H01L 21/3125 |
| | | | 438/622 |

(Continued)

FOREIGN PATENT DOCUMENTS

| | | |
|---|---|---|
| CN | 113644066 A | 11/2021 |
| CN | 114068545 A | 2/2022 |
| CN | 114121778 A | 3/2022 |

OTHER PUBLICATIONS

International Search Report cited in PCT/CN2022/083716 mailed Nov. 30, 2022, 10 pages.

*Primary Examiner* — Victoria K. Hall
(74) *Attorney, Agent, or Firm* — Kilpatrick Townsend & Stockton LLP

(57) ABSTRACT

Disclosed are a memory, a semiconductor structure, and a manufacturing method thereof. The manufacturing method includes: providing a substrate, where the substrate includes bit line structures, a first isolation layer covering sidewalls of the bit line structures and a second isolation layer covering a surface of the first isolation layer; removing the second isolation layer on a top of the first isolation layer to expose the top of the first isolation layer, and removing the first isolation layer so as to form a void between the bit line structure and the second isolation layer; and forming a sealing layer covering an opening of the void.

11 Claims, 7 Drawing Sheets

(56) References Cited

U.S. PATENT DOCUMENTS

| | | | |
|---|---|---|---|
| 2005/0199585 A1* | 9/2005 | Wang | H01L 21/32139 |
| | | | 257/E21.27 |
| 2010/0300518 A1* | 12/2010 | Moslehi | H10F 77/14 |
| | | | 257/E31.038 |
| 2011/0212548 A1 | 9/2011 | Kanakasabapathy et al. | |
| 2015/0060970 A1* | 3/2015 | Sasaki | H10D 1/716 |
| | | | 257/532 |
| 2015/0187428 A1* | 7/2015 | Okada | H10B 41/41 |
| | | | 365/185.2 |
| 2016/0225710 A1* | 8/2016 | Hwang | H01L 21/02164 |
| 2018/0226410 A1* | 8/2018 | Chang | H10B 12/485 |
| 2018/0337186 A1* | 11/2018 | Chang | H10B 12/482 |
| 2021/0134808 A1* | 5/2021 | Kim | H10B 12/053 |
| 2021/0375939 A1 | 12/2021 | Zhu et al. | |
| 2022/0068938 A1 | 3/2022 | Lu | |
| 2022/0352178 A1* | 11/2022 | Kim | H10B 12/09 |

* cited by examiner

Provide a substrate, where the substrate includes an array region and a peripheral region that are distributed side-by-side, an isolation layer, a conductive contact plug, and a plurality of bit line structures that are spaced from each other are formed in the array region, the bit line structures extend along a direction perpendicular to the substrate, the isolation layer covers sidewalls of the bit line structures, the conductive contact plug is formed in a region surrounded by the isolation layer between adjacent bit line structures, and a stacked film layer is formed in the peripheral region — S110

Form a mask layer covering the bit line structures, the isolation layer, the conductive contact plug, and the stacked film layer — S120

Etch the mask layer to expose a top of the isolation layer — S130

FIG. 3

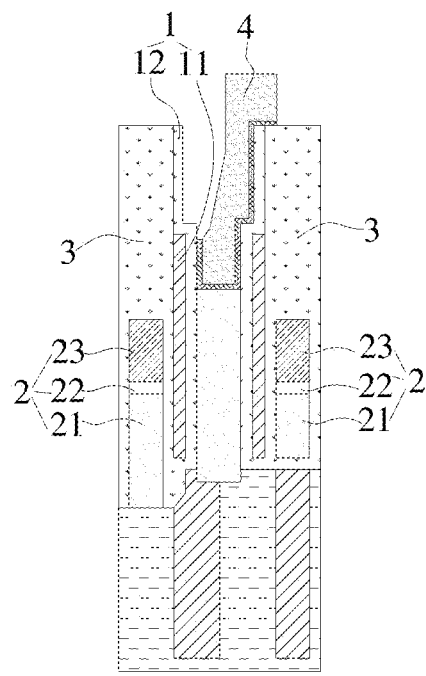

FIG. 4

```
Remove the second isolation layer on a top of the first     S1401
isolation layer based on a dry etching process, to expose
        the top of the first isolation layer
                          │
                          ▼
  Remove the first isolation layer based on the dry etching   S1402
                        process
```

MEMORY, SEMICONDUCTOR STRUCTURE, AND MANUFACTURING METHOD THEREOF

CROSS-REFERENCE TO RELATED APPLICATIONS

The present disclosure is a continuation application of International Patent Application No. PCT/CN2022/083716, filed on Mar. 29, 2022, which claims the priority to Chinese Patent Application No. 202210255938.2, titled "MEMORY, SEMICONDUCTOR STRUCTURE, AND MANUFACTURING METHOD THEREOF" and filed on Mar. 15, 2022. The entire contents of International Patent Application No. PCT/CN2022/083716 and Chinese Patent Application No. 202210255938.2 are incorporated herein by reference in present disclosure.

TECHNICAL FIELD

The present disclosure relates to the technical field of semiconductors, and specifically to a memory, a semiconductor structure, and a manufacturing method thereof.

BACKGROUND

Dynamic random access memories (DRAM) are widely applied to mobile devices such as mobile phones and tablet computers due to advantages of small size, high integration, and high transmission speed.

An existing dynamic random access memory includes an array region and a peripheral region. However, during a patterning process of the array region, affected by the manufacturing process, structural abnormalities are prone to occur in the peripheral region, reducing device yields.

It should be noted that the information disclosed above is merely intended to facilitate a better understanding of the background of the present disclosure, and therefore may include information that does not constitute the prior art known to those of ordinary skill in the art.

SUMMARY

According to one aspect of the present disclosure, a manufacturing method of a semiconductor structure is provided, including:
  providing a substrate, where the substrate includes an array region and a peripheral region that are distributed side-by-side, an isolation layer, a conductive contact plug, and a plurality of bit line structures spaced from each other are formed in the array region, the bit line structures extend along a direction perpendicular to the substrate, the isolation layer covers sidewalls of the bit line structures, the conductive contact plug is formed in a region surrounded by the isolation layer between adjacent bit line structures, and a stacked film layer is formed in the peripheral region;
  forming a mask layer covering the bit line structures, the isolation layer, the conductive contact plug, and the stacked film layer; and
  etching the mask layer to expose a top of the isolation layer.

According to one aspect of the present disclosure, a semiconductor structure is provided, including:
  a substrate, where the substrate includes an array region and a peripheral region that are distributed side-by-side, a plurality of bit line structures spaced from each other, a second isolation layer that extends in a same direction as a sidewall of the bit line structure, and a void located between the second isolation layer and the sidewall of the bit line structure are formed in the array region, a conductive contact plug is formed in a region surrounded by the second isolation layer between adjacent bit line structures, and a stacked film layer is formed in the peripheral region;
  a mask layer covering a surface of the stacked film layer; and
  a sealing layer covering an opening of the void.

According to one aspect of the present disclosure, a memory is provided, including the semiconductor structure according to any one of the foregoing implementations.

BRIEF DESCRIPTION OF THE DRAWINGS

The drawings incorporated into the specification and constituting part of the specification illustrate the embodiments of the present disclosure, and serve, together with the specification, to explain the principles of the present disclosure. Apparently, the drawings described below show merely some embodiments of the present disclosure, and those of ordinary skill in the art may derive other embodiments from these embodiments without creative efforts.

FIG. 3 is a flowchart of a manufacturing method of a semiconductor structure according to an implementation of the present disclosure;

FIG. 4 is a schematic structural diagram of an array region of a substrate according to an implementation of the present disclosure;

DETAILED DESCRIPTION

Figure 1:
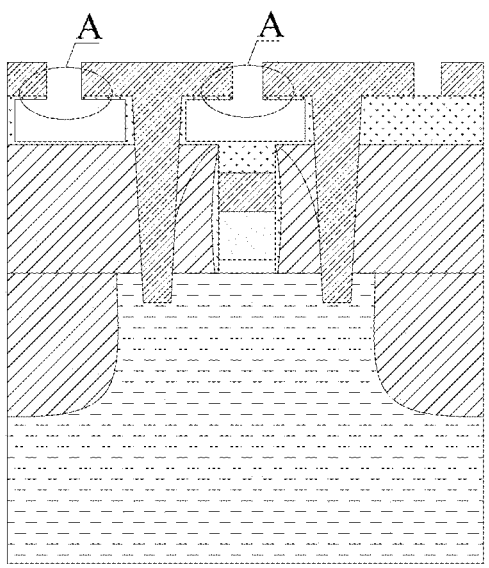
FIG. 1 is a schematic diagram of an array region in the related art.

The exemplary implementations are described more comprehensively below with reference to the accompanying drawings. However, the exemplary implementations may be implemented in various forms, and may not be construed as being limited to those described herein. On the contrary, these implementations are provided to make the present disclosure comprehensive and complete and to fully convey the concept of the exemplary implementations to those skilled in the art. The same reference numerals in the figures indicate the same or similar structures, and thus their detailed descriptions are omitted. Besides, the accompanying drawings are merely exemplary illustrations of the present disclosure, and are not necessarily drawn to scale.

Although relative terms such as "upper" and "lower" are used in this specification to describe the relative relationship between one component and another component in the drawings, these terms are used in this specification only for convenience, for example, according to the orientation of the examples described in the accompanying drawings. It can be understood that if the apparatus in the drawings is turned upside down, the components described as "upper" become the "lower" components. When a structure is "on" other structures, it may mean that the structure is integrally formed on other structures, or that the structure is "directly" disposed on other structures, or that the structure is "indirectly" disposed on other structures through another structure.

The terms "one", "a", "the", "said", and "at least one" are used to indicate the presence of one or more elements/components/and the like; the terms "includes" and "has" are used to indicate an open-ended inclusion and to mean that additional elements/components/and the like may exist in addition to the listed elements/components/and the like. Terms such as "first", "second", and "third" are used only as labels and are not intended to limit a number of objects.

Figure 2:
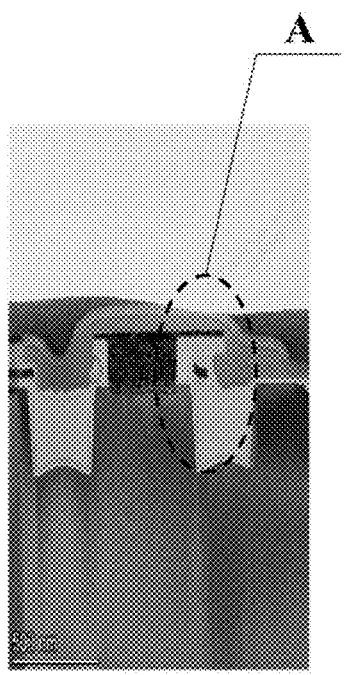
FIG. 2 is a topography diagram of an array region in the related art.

As shown in FIG. 1, a semiconductor structure mainly includes a substrate and a plurality of bit line structures and a circuit structure formed in the substrate. The bit line structures are spaced by an insulating material. During manufacturing, patterning processing needs to be performed on the insulating material to reduce a parasitic capacitor between bit line structures. Specifically, the substrate includes an array region and a peripheral region. The bit line structures are mainly distributed in the array region, and the circuit structure is mainly distributed in the peripheral region. During a product manufacturing process, an insulating layer between adjacent bit line structures in the array region may be etched to form a void to reduce a parasitic capacitor between bit line structures. However, in this procedure, due to the limitation of the process, the structure of the peripheral region is easily damaged and product yields are low. For example, as shown in FIG. 1 and FIG. 2, during etching of the array region, an insulating layer of region A in the peripheral region is easily damaged. As a result, holes appear in region A, and it is difficult to subsequently deposit an insulating layer. Besides, in the process of etching the array region to form the void, an etching gas is easy to pass through holes and then is in contact with an internal circuit of the peripheral region. Therefore, etching easily damages the internal circuit of the peripheral region and product yields are reduced.

Based on this, the present disclosure provides a manufacturing method of a semiconductor structure, to solve the foregoing technical problem. The semiconductor structure may be a dynamic random access memory (DRAM), a static random access memory (SRAM), or the like. FIG. 3 is a flowchart of a manufacturing method of a semiconductor structure according to an implementation of the present disclosure. Referring to FIG. 3, the manufacturing method may include step S110 to step S130.

Step S110: Provide a substrate, where the substrate includes an array region and a peripheral region that are distributed side-by-side, an isolation layer, a conductive contact plug, and a plurality of bit line structures spaced from each other are formed in the array region, the bit line structures extend along a direction perpendicular to the substrate, the isolation layer covers sidewalls of the bit line structures, the conductive contact plug is formed in a region surrounded by the isolation layer between adjacent bit line structures, and a stacked film layer is formed in the peripheral region.

Step S120: Form a mask layer covering the bit line structures, the isolation layer, the conductive contact plug, and the stacked film layer.

Step S130: Etch the mask layer to expose a top of the isolation layer.

In the manufacturing method of a semiconductor structure of the present disclosure, on the one hand, the isolation layer can insulate and protect two sides of the bit line structure and the conductive contact plug, to prevent a short circuit between the bit line structure and the conductive contact plug, reduce the risk of a short circuit of the device, and improve product yields. On the other hand, in the process of etching to expose the top of the isolation layer, the mask layer can protect the surface of the stacked film layer in the peripheral region, to avoid damaging the film layer on the surface of the peripheral region in a process of etching the array region. In addition, during subsequent patterning processing of the isolation layer, the mask layer can still be used as a protective barrier to protect the surface of the stacked film layer in the peripheral region, to further improve product yields.

The steps of the manufacturing method of a semiconductor structure in this implementation of the present disclosure are described in detail below.

As shown in FIG. 3, in step S110, a substrate is provided, where the substrate includes an array region and a peripheral region that are distributed side-by-side, an isolation layer, a conductive contact plug, and a plurality of bit line structures spaced from each other are formed in the array region, the bit line structures extend along a direction perpendicular to the substrate, the isolation layer covers sidewalls of the bit line structures, the conductive contact plug is formed in a region surrounded by the isolation layer between adjacent bit line structures, and a stacked film layer is formed in the peripheral region.

The substrate can be a flat plate structure and includes a word line structure (not shown in the figure). A bit line structure forming region and a capacitor contact hole forming region can be pre-defined on the substrate. The bit line structure forming region can be used to form a bit line structure, and the capacitor contact hole forming region can be used to form a conductive contact plug. The substrate may be a rectangle, a circle, an ellipse, a polygon, or an irregular shape. The substrate may be made of silicon or another semiconductor material. A shape and a material of the substrate are not particularly limited thereto.

The substrate may have an array region and a periphery region, and the array region can be used to form a capacitor array and a bit line structure. The array region may be circular, rectangular, or irregular, which is not particularly limited thereto. The peripheral region may be distributed adjacent to the array region. For example, the peripheral region may be circular and may surround the periphery of the array region. For example, the peripheral region may be a circular ring region, which is not particularly limited thereto. The peripheral region can be used to form a circuit structure, and the circuit structure can be connected to a memory array module in the array region, so as to control charging and discharging of the memory array module through the circuit structure.

The substrate may include a sacrificial layer, and a thickness of the sacrificial layer may be the same as a required thickness of the bit line structure. The sacrificial layer may be formed through atomic layer deposition, vacuum evaporation, magnetron sputtering, chemical vapor deposition, physical vapor deposition, or the like. Certainly, the sacrificial layer may also be formed through another process. A forming process of the sacrificial layer is not particularly limited thereto.

The sacrificial layer may be patterned through a photolithography process according to the pre-defined bit line forming region and capacitor contact hole forming region, to form a plurality of trenches and a plurality of through holes distributed side by side in the sacrificial layer. It should be noted that the trenches may be at least distributed in the array region.

In a direction parallel to the substrate, two ends of the trench may be in communication with each other, and the trench may extend along the direction parallel to the substrate. The through holes may be circular, rectangular, or irregular, which is not particularly limited thereto.

There may be a plurality of through holes. The through holes may be arranged in a column and may be arranged at intervals along an extending direction of the trenches. In an implementation, each trench and each column of through holes may form a group. A plurality of groups of trenches and through holes distributed side by side may be formed. Moreover, columns formed by trenches and through holes in two adjacent groups are distributed alternately, that is, the through holes are distributed on two sides of the trench, and may be disposed at intervals along the extending direction of the trench.

An insulating layer may be formed on a sidewall of each trench. The insulating layer may be a film or a coating fittedly attached to the sidewall of the trench, which is not particularly limited thereto. The insulating layer may be made of an insulating material, to insulate and protect the structure in each trench and prevent a short circuit of the structure.

In an exemplary embodiment of the present disclosure, as shown in FIG. 4, an isolation layer 1 may include a first isolation layer 11 and a second isolation layer 12. The second isolation layer 12 may be formed on a side wall of each trench. The second isolation layer 12 may be a film or a coating fittedly attached to the side wall of the trench, which is not particularly limited thereto.

The second isolation layer 12 may be made of an insulating material, to insulate and protect the structure in each trench and prevent a short circuit of the structure. For example, the second isolation layer 12 may be made of silicon oxide. The second isolation layer 12 may be formed on the sidewall of each trench through chemical vapor deposition, physical vapor deposition, thermal evaporation, atomic layer deposition, or the like. Certainly, the second isolation layer 12 may be formed through another process, which is not particularly limited thereto.

The first isolation layer 11 may be formed on a surface of the second isolation layer 12 away from the sidewall of the trench. The first isolation layer 11 may be a film or a coating fittedly attached to the surface of the second isolation layer 12, which is not particularly limited thereto. The first isolation layer 11 may be made of an insulating material, so that structures in the trenches can be insulated and protected by both the first isolation layer 11 and the second isolation layer 12, to further prevent short circuits of the structures. For example, the first isolation layer 11 may be made of silicon oxide. The first isolation layer 11 may be formed on the surface of the second isolation layer 12 through chemical vapor deposition, physical vapor deposition, thermal evaporation, or atomic layer deposition. Certainly, the first isolation layer 11 may be formed through another process, which is not particularly limited thereto.

The bit line structure 2 may be formed in each trench and may be made of a conductive material. For example, the bit line structure 2 may include a first conductive layer 21, a second conductive layer 22, and a third conductive layer 23 that are stacked. The first conductive layer 21, the second conductive layer 22, and the third conductive layer 23 may be distributed along a direction perpendicular to the substrate. The second conductive layer 22 is located between the first conductive layer 21 and the third conductive layer 23. A material of the first conductive layer 21 can be polycrystalline silicon; a material of the second conductive layer 22 can be titanium nitride; and a material of the third conductive layer 23 can be tungsten.

In an implementation, a process such as vacuum evaporation, magnetron sputtering, chemical vapor deposition, physical vapor deposition, thermal evaporation, or atomic layer deposition can be used to sequentially form the first conductive layer 21, the second conductive layer 22, and the third conductive layer 23 in the trench. Therefore, the first conductive layer 21, the second conductive layer 22, and the third conductive layer 23 jointly form the bit line structure 2. It should be noted that the bit line structure 2 is located in the trench, the first isolation layer 11 covers a sidewall of the bit line structure 2, and the second isolation layer 12 covers a surface of the first isolation layer 11.

In another exemplary embodiment of the present disclosure, the bit line structure 2 may be formed in the trench first, and then the first isolation layer 11 may be formed on the sidewall of the bit line structure 2, and the second isolation layer 12 is formed on the surface of the first isolation layer 11. In this procedure, the second isolation layer 12 can fill a gap between the first isolation layer 11 and the trench, and can cover the top of the first isolation layer 11 at the same time.

In an exemplary embodiment of the present disclosure, a capping layer 3 is further provided between the isolation layer 1 and the bit line structure 2. A process such as chemical vapor deposition, physical vapor deposition, thermal evaporation, or atomic layer deposition can be used to form the capping layer 3 on a surface of each bit line structure 2. For example, the capping layer 3 can cover a sidewall and the top of each bit line structure 2. The first isolation layer 11 and the second isolation layer 12 are located on a sidewall of the capping layer 3. The capping layer 3 may be made of an insulating material, so that two adjacent bit line structures 2 can be insulated and protected by all the capping layer 3, the first isolation layer 11, and the second isolation layer 12, to prevent a short circuit between the bit line structure 2 and other surrounding structures, thereby reducing the risk of a short circuit of the device. The capping layer 3 and the second isolation layer 12 may be made of a same material such as silicon nitride, and certainly may be made of other insulating materials, which are not listed herein.

In an implementation, a distance between the top of the capping layer 3 and the bottom of the capacitor contact hole may be 650 angstroms, and a distance between the top of the first isolation layer 11 and the top of the capping layer 3 is 300 angstroms. In this way, during subsequent formation of a void, this helps an etching gas enter smoothly. A distance between the top of the first isolation layer 11 and the bottom of the capacitor contact hole can be 350 angstroms. During subsequent etching, this can avoid etching a structure at the bottom of the capacitor contact hole, thereby avoiding failure of the void.

In an exemplary embodiment of the present disclosure, a conductive material may be deposited in each through hole located in the array area, thereby forming the conductive contact plug 4. As shown in FIG. 4, the conductive contact plug 4 may be filled in a region surrounded by the isolation layer 1 between two adjacent bit line structures 2, for example, the conductive contact plug 4 can be filled in a region surrounded by the second isolation layer 12 between two adjacent bit line structures 2. For example, the conductive material may be polycrystalline silicon or tungsten. The conductive contact plug 4 may be formed in each through hole through vacuum evaporation, magnetron sputtering, chemical vapor deposition, physical vapor deposition, thermal evaporation, atomic layer deposition, or the like. Certainly, the conductive contact plug 4 may be also formed through other processes, which are not listed herein.

It should be noted that the conductive contact plugs 4 may be distributed at intervals in an array, and one conductive contact plug 4 may be distributed between every two adjacent bit line structures 2. An insulating material may space two adjacent conductive contact plugs 4 from each other, thereby avoiding a short circuit or coupling between two adjacent conductive contact plugs 4. The insulating material may be a material of the isolation layer 1 or a material of the capping layer 3, which is not particularly limited herein.

In an implementation, the conductive contact plug 4 can be in a "Z" shape, and a top surface of the bottom of the "Z" shape can be lower than the top of the isolation layer 1, thereby avoiding damage to an oxide around the conductive contact plug 4 during etching to form a void. For example, a distance between the top surface of the bottom of the "Z" shape and the top of the isolation layer 1 may be 130 angstroms. A thickness of a slope 30 of the "Z" shape may be 11 nm to 12 nm. For example, the thickness may be 11 nm, 11.2 nm, 11.4 nm, 11.6 nm, 11.8 nm, or 12 nm, or certainly may be other thicknesses, which are not listed herein.

After the conductive contact plug 4 is formed, a sacrificial layer may be removed. For example, an acid solution may be used for wet etching. In use, a preparation ratio of acid solution to deionized water may be set according to a specific material of the sacrificial layer. The ratio and concentration of the etching solution are not particularly limited thereto.

Figure 5:
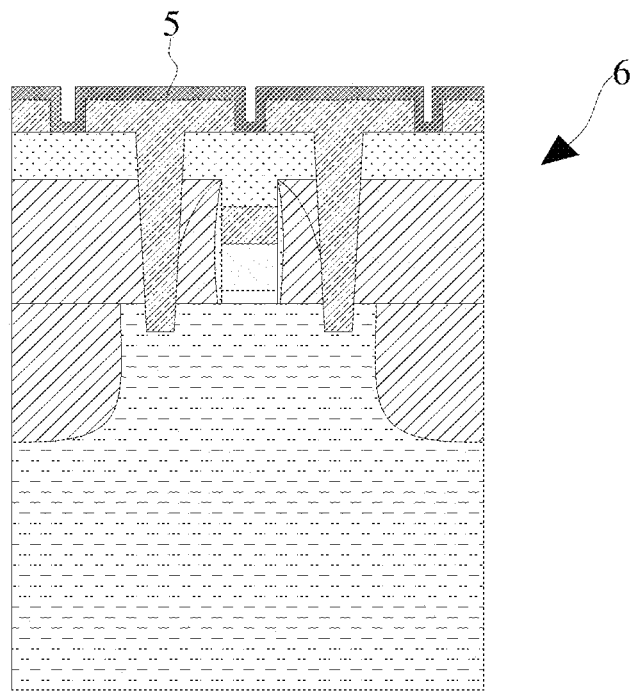
FIG. 5 is a schematic structural diagram of a peripheral region of a substrate according to an implementation of the present disclosure.

As shown in FIG. 5, a stacked film layer 6 may be provided in the peripheral region, the stacked film layer 6 may include a driving circuit and an insulating layer, and there may be a plurality of driving circuits. The driving circuits can be spaced by an insulating layer to avoid coupling or a short circuit between the driving circuits.

As shown in FIG. 3, in step S120, the mask layer covering the bit line structure, the isolation layer, the conductive contact plug, and the stacked film layer is formed.

A mask layer 5 can be formed on surfaces of the bit line structure 2, the isolation layer 1, the conductive contact plug 4, and the stacked film layer 6. The mask layer 5 can be fittedly attached to the surfaces of the bit line structure 2, the isolation layer 1, the conductive contact plug 4, and the stacked film layer 6, and may be a thin film formed on the surfaces of the bit line structure 2, the isolation layer 1, the conductive contact plug 4, and the stacked film layer 6, or may be a coating formed on the surfaces of the bit line 20) structure 2, the isolation layer 1, the conductive contact plug 4, and the stacked film layer 6. A type of the mask layer 5 is not particularly limited herein.

It should be noted that when the stacked film layer 6 includes an insulating layer and a driving circuit, the mask layer 5 can cover surfaces of the insulating layer and the driving circuit at the same time, so that during the subsequent etching of the array region, the mask layer 5 can protect surfaces of the insulating layer and the driving circuit in the peripheral region, to avoid damage to the insulating layer and the driving circuit in the peripheral region, which can improve product yields.

For example, a material of the mask layer 5 can be an insulating material, for example, the material can be silicon nitride. The mask layer 5 can be deposited on the surfaces of the bit line structure 2, the isolation layer 1, the conductive contact plug 4, and the stacked film layer 6 by using a process such as physical vapor deposition, chemical vapor deposition, atomic layer deposition, vacuum evaporation, or magnetron sputtering. Certainly, the mask layer 5 may also be formed on the surfaces of the bit line structure 2, the isolation layer 1, the conductive contact plug 4, and the stacked film layer 6 by using other processes. A formation process of the mask layer 5 is not particularly limited herein.

In an exemplary embodiment of the present disclosure, a thickness of the mask layer 5 may be 2 nm to 10 nm, for example, may be 2 nm, 4 nm, 6 nm, 8 nm, or 10 nm, and certainly may be other thicknesses, which are not be listed herein, as long as it can be ensured that the peripheral region is not damaged when patterning processing is performed on the array region.

Figure 6:
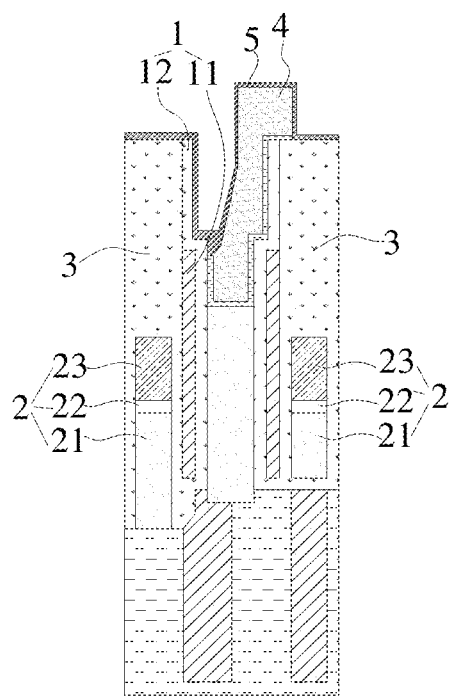
FIG. 6 is a schematic structural diagram of an array region obtained after step S120 is completed according to an implementation of the present disclosure.

In an exemplary embodiment of the present disclosure, to ensure that a thickness of the mask layer 5 is the same in various regions, the mask layer 5 may be formed by using a plurality of deposition processes. For example, the mask layer 5 can include one or more mask sub-layers. When the mask layer 5 includes one mask sub-layer, the mask sub-layer can be formed by a plurality of deposition processes, and a thickness in each deposition is relatively small, thereby avoiding thick deposition in some regions and thin deposition in other regions, and ensuring that the thickness of the mask layer 5 is approximately the same in various regions. When the mask layer 5 includes a plurality of mask sub-layers, materials of the mask sub-layers can be the same or different and are not particularly limited herein. During depositing of the mask sub-layers, one mask sub-layer can be deposited for each time. Thicknesses of adjacent mask sub-layers may be the same or different, which are not particularly limited herein. In an implementation of the present disclosure, the structure of the array region after step S120 is completed is shown in FIG. 6.

Figure 7:
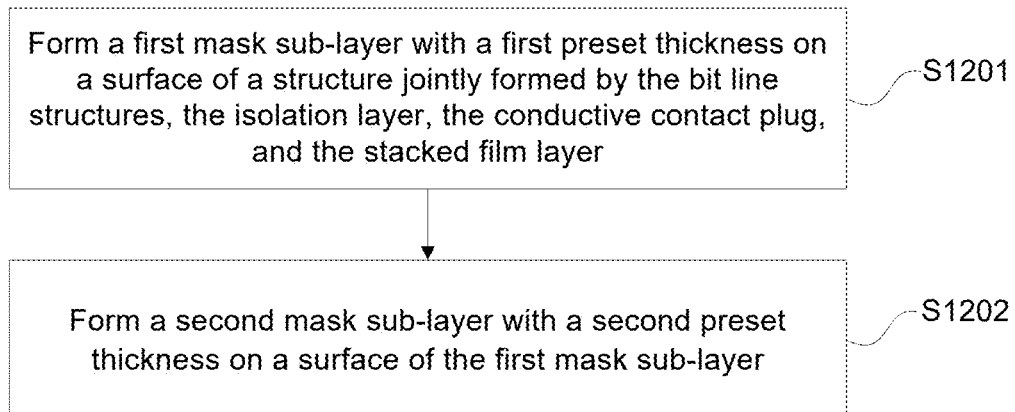
FIG. 7 is a flowchart of step S120 according to an implementation of the present disclosure.

In an exemplary embodiment of the present disclosure, the mask layer 5 may include a plurality of mask sub-layers, for example, the mask layer 5 may include a first mask sub-layer and a second mask sub-layer to form the mask layer 5 covering the bit line structure 2, the isolation layer 1, the conductive contact plug 4, and the stacked film layer 6. That is, step S120 may include step S1201 and step S1202, as shown in FIG. 7.

Step S1201: Form a first mask sub-layer with a first preset thickness on a surface of a structure jointly formed by the bit line structures, the isolation layer, the conductive contact plug, and the stacked film layer.

The first mask sub-layer may be a thin film formed on the surfaces of the bit line structure 2, the isolation layer 1, the conductive contact plug 4, and the stacked film layer 6, or may be a coating formed on the surfaces of the bit line structure 2, the isolation layer 1, the conductive contact plug 4, and the stacked film layer 6. A specific form of the first mask sub-layer is not particularly limited herein.

A material of the first mask sub-layer can be an insulating material, for example, can be silicon nitride. The first mask sub-layer with the first preset thickness can be formed on the surfaces of the bit line structure 2, the isolation layer 1, the conductive contact plug 4, and the stacked film layer 6 by using a process such as physical vapor deposition, chemical vapor deposition, or atomic layer deposition. Certainly, the first mask sub-layer can also be formed by using other processes. A formation process of the first mask sub-layer is not particularly limited herein.

In an implementation, the first preset thickness may be 2 nm to 4 nm, for example, may be 2 nm, 2.5 nm, 3 nm, 3.5 nm, or 4 nm, and certainly may be other thicknesses, which are not listed herein.

Step S1202: Form a second mask sub-layer with a second preset thickness on a surface of the first mask sub-layer.

The second mask sub-layer may be formed on a side of the first mask sub-layer away from the substrate. The second mask sub-layer may be a thin film formed on the surface of the first mask sub-layer, or may be a coating formed on the surface of first mask sub-layer. A specific form of the second mask sub-layer is not particularly limited herein.

A material of the second mask sub-layer may be an insulating material and may be the same as that of the first mask sub-layer. For example, the materials of the first mask sub-layer and the second mask sub-layer may both be silicon nitride. The second mask sub-layer with the second preset thickness can be formed on the surface of the first mask sub-layer by using a process such as physical vapor deposition, chemical vapor deposition, or atomic layer deposition. Certainly, the second mask sub-layer can also be formed by using other processes. A formation process of the second mask sub-layer is not particularly limited herein.

In an implementation, the second preset thickness may be 3 nm to 6 nm, for example, may be 3 nm, 4 nm, 5 nm, or 6 nm, and certainly may be other thicknesses, which are not listed herein.

As shown in FIG. 3, in step S130, the mask layer is etched to expose the top of the isolation layer.

The mask layer 5 on the top of the isolation layer 1 may be removed by an etching process to expose the top of the isolation layer 1. In this procedure, the mask layer 5 in another region in the array region can also be removed by using a same etching process, to avoid that an additional etching process is established to remove the mask layer 5 in another region in the array region, which can simplify the processes and reduce manufacturing costs. That is, the mask layer 5 on the surfaces of the bit line structure 2, the first isolation layer 11, the second isolation layer 12, and the conductive contact plug 4 can be removed at the same time, and only the mask layer 5 on the surfaces of the insulating layer and the driving circuit in the peripheral region are reserved.

For example, the mask layer 5 on the surfaces of the bit line structure 2, the first isolation layer 11, the second isolation layer 12, and the conductive contact plug 4 can be removed by using a dry etching process, and only the mask layer 5 on the surfaces of the insulating layer and the driving circuit in the peripheral region are reserved.

In an exemplary embodiment of the present disclosure, when the mask layer 5 includes one mask sub-layer, the mask sub-layer can be etched for a plurality of times. The mask layer 5 on the surfaces of the bit line structure 2, the first isolation layer 11, the second isolation layer 12, and the conductive contact plug 4 can be etched at the same time in each etching procedure, until the top of the isolation layer 1 is exposed. That is, in each etching process, a particular thickness of the mask sub-layer can be etched. In this way, a thickness in each etching is small, which can ensure that the mask layer 5 on a surface of a region corresponding to each structure in the array region can be etched exactly without damaging any structure in the array region. If the mask layer 5 in a certain region is removed by etching in a current etching process, in a next etching process, the mask layer 5 in a region other than this certain region can be etched while a structure in this certain region is not etched, so as to avoid damage to the structure in this certain region and help to improve product yields. Certainly, when the mask layer 5 includes one mask sub-layer, the mask sub-layer can also be etched once, as long as no structure in each region in the array region is damaged. A number of etching times is not particularly limited herein.

Figure 8:
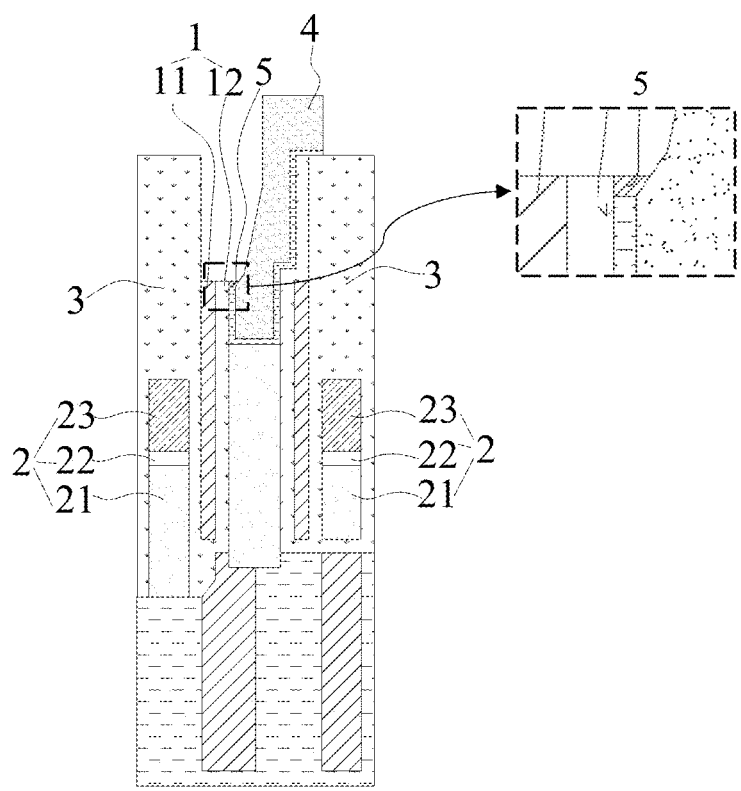
FIG. 8 is a schematic structural diagram of an array region obtained after step S130 is completed according to an implementation of the present disclosure.

In an exemplary embodiment of the present disclosure, when the mask layer 5 includes a plurality of mask sub-layers, the mask sub-layers can be etched sub-layer by sub-layer. The mask layer 5 on the surfaces of the bit line structure 2, the first isolation layer 11, the second isolation layer 12, and the conductive contact plug 4 can be etched at the same time in each etching procedure, until the top of the isolation layer 1 is exposed. That is, the mask layer 5 may be etched for a plurality of times, and in each etching process, one mask sub-layer can be etched. In this way, a thickness in each etching is small, which can ensure that the mask layer 5 on a surface of a region corresponding to each structure in the array region can be etched exactly without damaging any structure in the array region. If the mask layer 5 in a certain region is removed by etching in a current etching process, in a next etching process, the mask layer 5 in a region other than this certain region can be etched while a structure in this certain region is not etched, so as to avoid damage to the structure in this certain region and help to improve product yields. Certainly, when the mask layer 5 includes a plurality of mask sub-layers, the plurality of mask sub-layers can also be etched once, as long as no structure in each region in the array region is damaged. A number of etching times is not particularly limited herein. In an implementation of the present disclosure, the structure of the array region after step S130 is completed is shown in FIG. 8.

Figure 9:
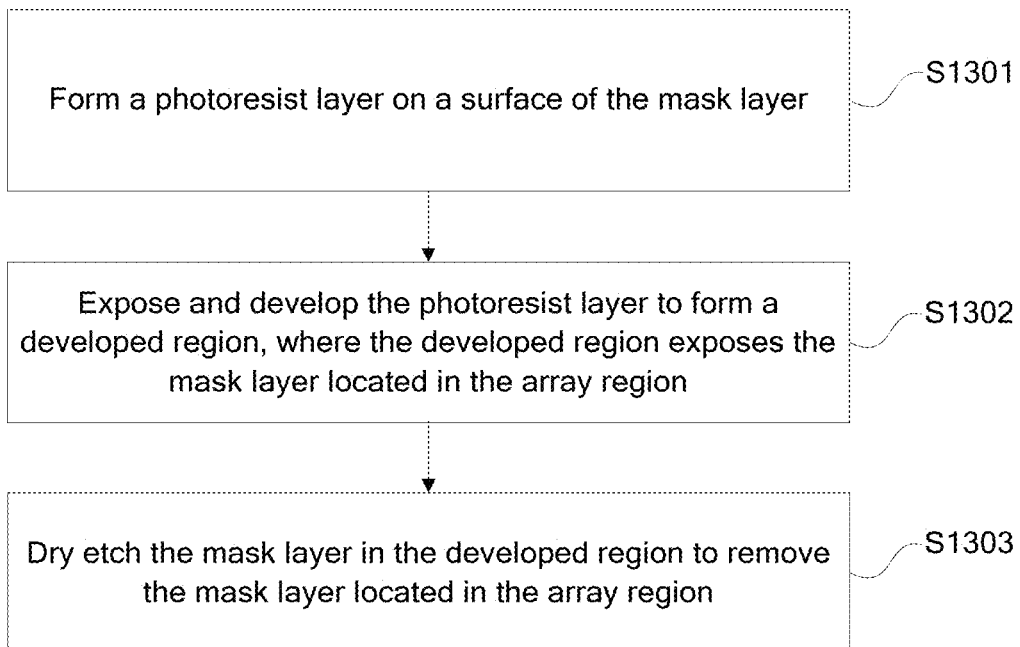
FIG. 9 is a flowchart of step S130 according to an implementation of the present disclosure.

In an exemplary embodiment of the present disclosure, the mask layer 5 on the surfaces of the bit line structure 2, the first isolation layer 11, the second isolation layer 12, and the conductive contact plug 4 is removed, that is, step S130 may include step S1301 to step S1303, as shown in FIG. 9.

Step S1301: Form a photoresist layer on a surface of the mask layer.

A photoresist layer may be formed on a surface of the mask layer 5 away from the substrate by spin coating or other methods, and a material of the photoresist layer may be positive photoresist or negative photoresist, which is not limited herein.

Step S1302: Expose and develop the photoresist layer to form a developed region, where the developed region exposes the mask layer located in the array region.

The photoresist layer can be exposed by using a mask. A pattern of the mask can match with a desired pattern of the photoresist layer, for example, the pattern of the mask can match with a shape of the array region and a size of the mask can be the same as that of the array region. The exposed photoresist layer can be developed to form a developed region, and the developed region can expose the mask layer 5.

Step S1303: Dry etch the mask layer in the developed region to remove the mask layer located in the array region.

The mask layer 5 may be etched in the developed region by dry etching, to form an opening that may expose the conductive contact plug 4, the top of the isolation layer 1, and the capping layer 3 on top of the bit line structure 2 in the array region, thereby reserving the mask layer 5 on the surface of the peripheral region.

For example, the mask layer 5 can be plasma etched with an etching gas, thereby removing the mask layer 5 on the surface of the conductive contact plug 4, the top of the isolation layer 1, and the surface of the capping layer 3 on top of the bit line structure 2 in the array region. In an implementation, the mask layer can be selectively etched with an etching gas. For example, the etching gas can be HF. During plasma etching, the etching gas can diffuse in the device space and then enter laterally to etch the mask.

Figure 10:
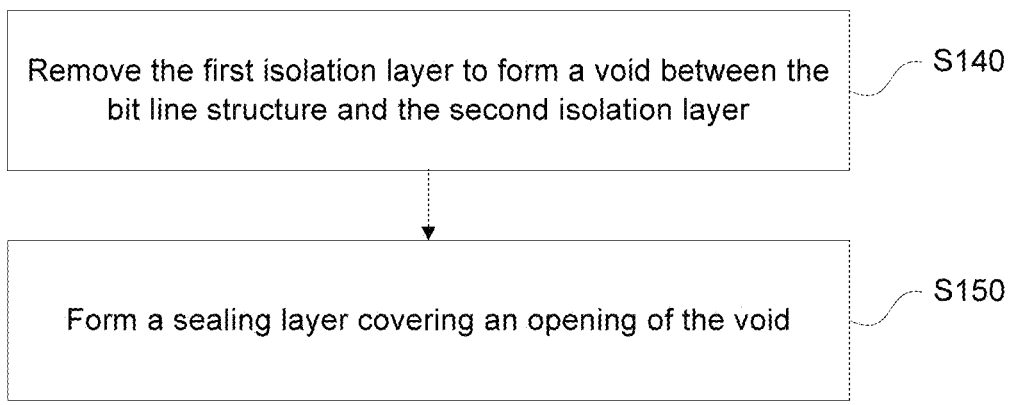
FIG. 10 is a flowchart of a manufacturing method of a semiconductor structure according to an implementation of the present disclosure.

In an exemplary embodiment of the present disclosure, the manufacturing method of a semiconductor structure of the present disclosure may further include step S140 and step S150, as shown in FIG. 10.

Step S140: Remove the first isolation layer to form a void between the bit line structure and the second isolation layer.

The first isolation layer 11 can be removed by using a dry etching process, thereby forming a void 7 between the bit line structure 2 and the second isolation layer 12, and the void 7 may be provided to reduce the parasitic capacitor between the bit line structures 2. In this procedure, since a structural surface of the peripheral region is covered by the mask layer 5, even if the film layer on the surface of the peripheral region is removed, what is removed is the material of the mask layer 5, and surfaces of the insulating layer and the driving circuit in the peripheral region are not damaged. In an implementation of the present disclosure, the structure of the array region after step S140 is completed is shown in FIG. 11.

In an implementation, a height of the void 7 can be greater than 100 angstroms, for example, can be 100 angstroms, 120 angstroms, 140 angstroms, 160 angstroms, 180 angstroms, or 200 angstroms, and certainly can also be other heights, which are not listed herein.

Figures 11, 12:
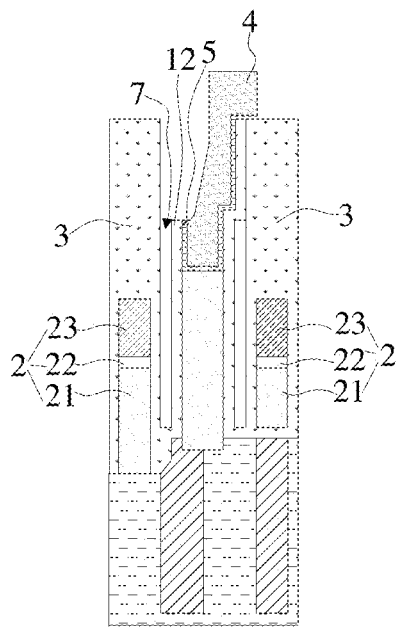
FIG. 11 is a schematic structural diagram of an array region obtained after step S140 is completed according to an implementation of the present disclosure.
FIG. 12 is a flowchart of step S140 according to an implementation of the present disclosure.

In an implementation, the first isolation layer 11 is removed to form the void 7 between the bit line structure 2 and the second isolation layer 12, that is, step S140 may include step S1401 and step S1402, as shown in FIG. 12.

Step S1401: Remove the second isolation layer on the top of the first isolation layer based on a dry etching process, to expose the top of the first isolation layer.

The second isolation layer 12 on the top of the first isolation layer 11 may be removed by using a plasma etching process, to expose the top of the first isolation layer 11. For example, the second isolation layer 12 on the top of the first isolation layer 11 may be selectively etched with an etching gas, for example, the etching gas may be HF. In this procedure, since a structural surface of the peripheral region is covered by the mask layer 5, even if the film layer on the surface of the peripheral region is removed, what is removed is the material of the mask layer 5, and surfaces of the insulating layer and the driving circuit in the peripheral region are not damaged.

Step S1402: Remove the first isolation layer based on the dry etching process.

Figure 13:
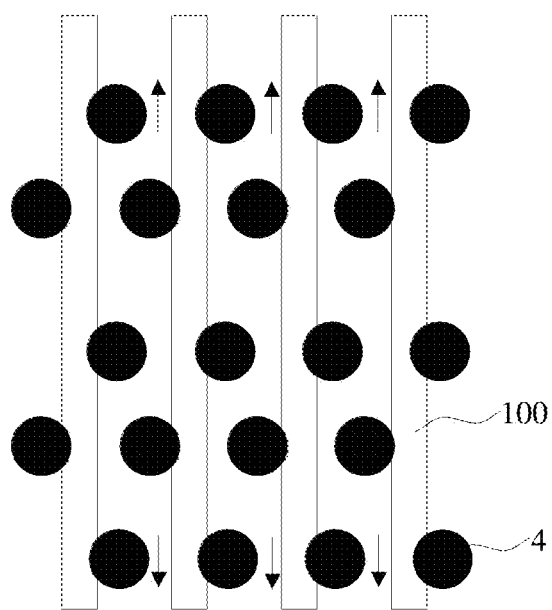
FIG. 13 is a schematic diagram of diffusion of an etching gas according to an implementation of the present disclosure.

The first isolation layer 11 can be removed by using a plasma etching process, thereby forming a void 7 between the bit line structure 2 and the second isolation layer 12, and the void 7 may be provided to reduce the parasitic capacitor between the bit line structures 2. In this procedure, since a structural surface of the peripheral region is covered by the mask layer 5, even if the film layer on the surface of the peripheral region is removed, what is removed is the material of the mask layer 5, and surfaces of the insulating layer and the driving circuit in the peripheral region are not damaged. For example, the first isolation layer 11 can be selectively etched with an etching gas, for example, the etching gas can be HF. As shown in FIG. 13, during etching, the etching gas can diffuse in a gap between the word line structure 100, the bit line structure 2, and the conductive contact plug 4 in a direction indicated by an arrow in FIG. 13, and then diffuse to a position of the first isolation layer 11 on the sidewall of the bit line structure 2, so that the first isolation layer 11 is removed.

Step S150: Form a sealing layer covering an opening of the void.

After the first isolation layer 11 is removed, the void 7 can be sealed to enhance the structural support strength. For example, a sealing layer 8 may be formed at the opening of the void 7 by using a process such as physical vapor deposition, chemical vapor deposition, or atomic layer deposition. A material of the sealing layer 8 may be an insulating material, for example, the material may be silicon nitride.

Figure 14:
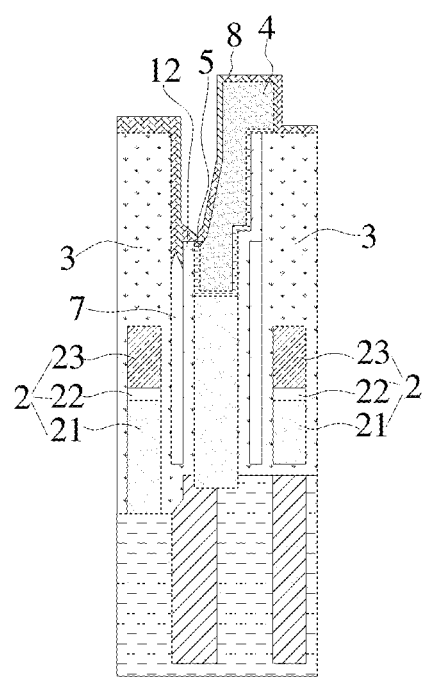
FIG. 14 is a schematic structural diagram of an array region obtained after step S150 is completed according to an implementation of the present disclosure.

It should be noted that, for the convenience of the process, the sealing layer 8 may be simultaneously formed on a surface of a structure jointly formed by the bit line structure 2, the second isolation layer 12, and the conductive contact plug 4. A thickness of the sealing layer 8 can be set according to the need of the product, which is not particularly limited herein. For example, the thickness can be 100 angstroms. In an implementation of the present disclosure, the structure of the array region after step S150 is completed is shown in FIG. 14.

It should be noted that although the steps of the manufacturing method of the semiconductor structure in the present disclosure are described in the accompanying drawings in a particular sequence, it is not required or implied that the steps must be performed in that particular sequence or that all of the steps shown must be performed to achieve the desired results. Additionally or alternatively, some steps may be omitted, a plurality of steps may be combined into a single step for execution, and/or a single step may be divided into a plurality of steps for execution.

An embodiment of the present disclosure further provides a semiconductor structure. FIG. 13 is a schematic diagram of the semiconductor structure according to an implementation of the present disclosure. Referring to FIG. 13, the semiconductor structure may include a substrate, a mask layer 5, and a sealing layer 8.

The substrate includes an array region and a peripheral region that are distributed side-by-side, a plurality of bit line structures 2 spaced from each other, a second isolation layer 12 that extends in a same direction as that of a sidewall of the bit line structure 2, and a void 7 located between the second isolation layer 12 and the sidewall of the bit line structure 2 are formed in the array region, a conductive contact plug 4 is formed in a region surrounded by the second isolation layer 12 between adjacent bit line structures 2, and a stacked film layer 6 is formed in the peripheral region.

The mask layer 5 covers a surface of the stacked film layer 6.

The sealing layer 8 covers an opening of the void 7.

The specific details, forming process, and beneficial effects of the part in the semiconductor structure have been described in detail in the corresponding manufacturing method of the semiconductor structure. Therefore, details are not described herein again.

An embodiment of the present disclosure further provides a memory. The memory may include the semiconductor structure in any one of the foregoing implementations. The specific details, forming process, and beneficial effects thereof have been described in detail in the corresponding manufacturing method of the semiconductor structure and semiconductor structure. Therefore, details are not described herein again.

For example, the memory may be a dynamic random access memory (DRAM), a static random access memory (SRAM), or the like. Certainly, other storage apparatuses may also be used, which are not listed herein.

Those skilled in the art may easily figure out other implementations of the present disclosure after considering the specification and practicing the scheme disclosed herein. This application is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the claims.

The invention claimed is:

1. A manufacturing method of a semiconductor structure, comprising:
providing a substrate, wherein the substrate comprises an array region and a peripheral region that are distributed side-by-side, an isolation layer, a conductive contact plug, and a plurality of bit line structures spaced from each other are formed in the array region, the bit line structures extend along a direction perpendicular to the substrate, the isolation layer comprises a first isolation layer and a second isolation layer, the first isolation layer covers sidewalls of the bit line structures, the second isolation layer covers a surface of the first isolation layer, the conductive contact plug is formed in a region surrounded by the second isolation layer between adjacent bit line structures, a stacked film layer is formed in the peripheral region, and the stacked film layer comprises a plurality of driving circuits and an insulating layer separating the driving circuits;
forming a mask layer covering the bit line structures, the isolation layer, the conductive contact plug, and the stacked film layer;
removing the mask layer on surfaces of the bit line structures, the first isolation layer, the second isolation layer, and the conductive contact plug;
removing the second isolation layer on a top of the first isolation layer based on a dry etching process, to expose the top of the first isolation layer, and removing the first isolation layer based on the dry etching process, so as to form a void between the bit line structure and the second isolation layer; and
forming a sealing layer covering an opening of the void.

2. The manufacturing method according to claim 1, wherein the mask layer comprises one or more mask sub-layers, and the removing the mask layer on surfaces of the bit line structures, the first isolation layer, the second isolation layer, and the conductive contact plug comprises:
etching the mask sub-layers for multiple times until the top of the second isolation layer on the top of the first isolation layer is exposed.

3. The manufacturing method according to claim 2, wherein the mask layer comprises a plurality of mask sub-layers, and the forming a mask layer covering the bit line structures, the isolation layer, the conductive contact plug, and the stacked film layer comprises:
forming a first mask sub-layer with a first preset thickness on a surface of a structure jointly formed by the bit line structures, the isolation layer, the conductive contact plug, and the stacked film layer; and
forming a second mask sub-layer with a second preset thickness on a surface of the first mask sub-layer;
wherein the first preset thickness is 2 nm to 4 nm, and the second preset thickness is 3 nm to 6 nm.

4. The manufacturing method according to claim 3, wherein materials of the first mask sub-layer and the second mask sub-layer are same.

5. The manufacturing method according to claim 1, wherein one conductive contact plug is distributed between every two adjacent bit line structures, and conductive contact plugs are distributed in an array.

6. The manufacturing method according to claim 1, wherein the removing the mask layer on surfaces of the bit line structures, the first isolation layer, the second isolation layer, and the conductive contact plug comprises:
forming a photoresist layer on a surface of the mask layer;
exposing and developing the photoresist layer to form a developed region, wherein the developed region exposes the mask layer located in the array region; and
dry etching the mask layer in the developed region to remove the mask layer located in the array region.

7. The manufacturing method according to claim 6, wherein the dry etching comprises plasma etching.

8. The manufacturing method according to claim 6, wherein an etching gas of the dry etching is HF.

9. The manufacturing method according to claim 1, wherein a material of the mask layer is silicon nitride.

10. A semiconductor structure, manufactured by the manufacturing method according to claim 1, comprising:
the substrate, wherein the substrate comprises the array region and the peripheral region that are distributed side-by-side, the plurality of bit line structures spaced from each other, the second isolation layer that extends in the same direction as a sidewall of the bit line structure, and the void located between the second isolation layer and the sidewall of the bit line structure are formed in the array region, the conductive contact plug is formed in the region surrounded by the second isolation layer between adjacent bit line structures, and the stacked film layer is formed in the peripheral region;
the mask layer covering a surface of the stacked film layer; and
the sealing layer covering the opening of the void.

11. A memory, comprising the semiconductor structure according to claim 10.

* * * * *